United States Patent
Cho et al.

(10) Patent No.: US 9,190,545 B2
(45) Date of Patent: Nov. 17, 2015

(54) OPTICAL DEVICE INCLUDING THREE-COUPLED QUANTUM WELL STRUCTURE HAVING MULTI-ENERGY LEVEL

(71) Applicants: SAMSUNG ELECTRONICS CO., LTD., Suwon-si (KR); GWANGJU INSTITUTE OF SCIENCE AND TECHNOLOGY, Gwangju (KR)

(72) Inventors: Yong-chul Cho, Suwon-si (KR); Yong-tak Lee, Gwangju (KR); Chang-young Park, Yongin-si (KR); Byung-hoon Na, Seoul (KR); Yong-hwa Park, Yongin-si (KR); Gun-wu Ju, Daegu (KR)

(73) Assignees: SAMSUNG ELECTRONICS CO., LTD., Suwon-si (KR); GWANGJU INSTITUTE OF SCIENCE AND TECHNOLOGY, Gwangju (KR),`

(*) Notice: Subject to any disclaimer, the term of this patent is extended or adjusted under 35 U.S.C. 154(b) by 0 days.

(21) Appl. No.: 14/283,797

(22) Filed: May 21, 2014

(65) Prior Publication Data

US 2015/0123077 A1 May 7, 2015

(30) Foreign Application Priority Data

Nov. 7, 2013 (KR) .......................... 10-2013-0134986

(51) Int. Cl.
*H01S 5/34* (2006.01)
*H01L 31/0352* (2006.01)
(Continued)

(52) U.S. Cl.
CPC ........ *H01L 31/035236* (2013.01); *G02F 1/017* (2013.01); *G02F 1/01725* (2013.01);
(Continued)

(58) Field of Classification Search
CPC ..... B82Y 20/00; H01S 5/3402; H01S 5/3407; H01S 5/34313; H01L 31/035236
See application file for complete search history.

(56) References Cited

U.S. PATENT DOCUMENTS 4,525,687 A 6/1985 Chemla et al.
5,017,973 A * 5/1991 Mizuta et al. .................. 257/15
(Continued)

FOREIGN PATENT DOCUMENTS

EP 0492420 A2 7/1992
EP 0511057 A1 10/1992
(Continued)

OTHER PUBLICATIONS

U.S. Appl. No. 14/148,009.*
(Continued)

*Primary Examiner* — John C Ingham
(74) *Attorney, Agent, or Firm* — Sughrue Mion, PLLC

(57) ABSTRACT

An optical device is provided including an active layer having two outer barriers and a coupled quantum well between the two outer barriers. The coupled quantum well includes a first quantum well layer, a second quantum well layer, a third quantum well layer, a first coupling barrier between the first quantum well layer and the second quantum well layer, and a second coupling barrier between the second quantum well layer and the third quantum well layer. A thickness of the first quantum well layer and a thickness of the third quantum well layer are each different from a thickness of the second quantum well layer. Also, an energy level of the first quantum well layer and an energy level of the third quantum well layer are each different from an energy level of the second quantum well layer.

18 Claims, 13 Drawing Sheets

| | Remarks | Material | Thickness[Å] |
|---|---|---|---|
| 141 | p-contact | p-GaAs | 100 |
| 140 | Top DBR 1 pairs | p-Al$_{0.31}$Ga$_{0.69}$As | 516 |
| | | p-Al$_{0.88}$Ga$_{0.12}$As | 688 |
| | | p-Al$_{0.31}$Ga$_{0.69}$As | 623 |
| | | p-Al$_{0.88}$Ga$_{0.12}$As | 688 |
| | Cladding | Al$_{0.31}$Ga$_{0.69}$As | 35 |
| | QW/Barrier 32 pairs (2-λ) | In$_{0.20}$Ga$_{0.80}$As | 10 |
| | | Al$_{0.20}$Ga$_{0.80}$As | 10 |
| | | GaAs | 64 |
| | | Al$_{0.20}$Ga$_{0.80}$As | 10 |
| | | In$_{0.20}$Ga$_{0.80}$As | 10 |
| 130 | | Al$_{0.31}$Ga$_{0.69}$As | 40 |
| | 3ACQW spare 1 pair | In$_{0.20}$Ga$_{0.80}$As | 10 |
| | | Al$_{0.20}$Ga$_{0.80}$As | 10 |
| | | GaAs | 64 |
| | | Al$_{0.20}$Ga$_{0.80}$As | 10 |
| | | In$_{0.20}$Ga$_{0.80}$As | 10 |
| | Cladding | Al$_{0.31}$Ga$_{0.69}$As | 35 |
| 120 | Bottom DBR 25.5 pairs | n-Al$_{0.88}$Ga$_{0.12}$As | 688 |
| | | n-Al$_{0.31}$Ga$_{0.69}$As | 623 |
| | | n-Al$_{0.88}$Ga$_{0.12}$As | 688 |
| 111 | n-contact | n-GaAs | 5000 |
| 110 | | GaAs substrate | |

(51) Int. Cl.
   *H01L 31/0232*   (2014.01)
   *G02F 1/017*    (2006.01)
   *H01L 33/06*    (2010.01)
   *G02F 1/015*    (2006.01)

(52) U.S. Cl.
   CPC .. *H01L31/02327* (2013.01); *G02F 2001/0155* (2013.01); *G02F 2201/34* (2013.01); *H01L 33/06* (2013.01)

(56) References Cited

U.S. PATENT DOCUMENTS

| | | | |
|---|---|---|---|
| 5,249,075 | A | 9/1993 | Delacourt et al. |
| 5,286,982 | A | 2/1994 | Ackley et al. |
| 5,416,338 | A | 5/1995 | Suzuki et al. |
| 5,426,312 | A | 6/1995 | Whitehead |
| 5,521,742 | A | 5/1996 | Ishimura |
| 5,569,934 | A | 10/1996 | Fujii et al. |
| 6,100,543 | A | 8/2000 | Sakata |
| 6,154,299 | A | 11/2000 | Gilbreath et al. |
| 6,298,077 | B1 * | 10/2001 | He ............... 372/45.01 |
| 6,331,911 | B1 | 12/2001 | Manassen et al. |
| 6,466,597 | B1 * | 10/2002 | Kume et al. ............ 372/45.01 |
| 6,956,232 | B2 | 10/2005 | Reynolds |
| 6,978,055 | B2 | 12/2005 | Miyazaki |
| 7,443,561 | B2 | 10/2008 | Bour et al. |
| 7,457,338 | B2 * | 11/2008 | Mawst et al. ............ 372/43.01 |
| 8,068,528 | B2 * | 11/2011 | Edamura et al. ........ 372/45.01 |
| 8,179,585 | B2 | 5/2012 | Nagase et al. |
| 2007/0248131 | A1 * | 10/2007 | Botez et al. ............ 372/43.01 |
| 2008/0315179 | A1 | 12/2008 | Kim et al. |
| 2011/0101301 | A1 * | 5/2011 | Lin et al. .................. 257/13 |
| 2012/0162380 | A1 | 6/2012 | Cho et al. |
| 2012/0230359 | A1 * | 9/2012 | Kato .................... 372/45.01 |

FOREIGN PATENT DOCUMENTS

| | | |
|---|---|---|
| EP | 2604574 A2 | 6/2013 |
| JP | 7-128622 A | 5/1995 |
| JP | 11-109298 A | 4/1999 |
| JP | 2000-156546 A | 6/2000 |
| JP | 2000-357789 A | 12/2000 |
| JP | 3278893 B2 | 4/2002 |
| KR | 10-2011-0086364 A | 7/2011 |
| KR | 10-2014-0089671 A | 7/2014 |

OTHER PUBLICATIONS

Liu, Hong, "High Speed, Low Driving Voltage Vertical Cavity MQW Modulators for Optical Interconnect and Communication," Stanford University, Mar. 2001, pp. total 134.

Park, Yong-hwa et al., "Micro Optical System Based 3D Imaging for Full HD Depth Image Capturing," Proc. of SPIE, vol. 8252, Apr. 5, 2012, pp. 82520X-1 to 82520X-15.

Garvin, Charles et al., "Overview of High-Speed Multiple Quantum Well Optical Modulator Devices and their Applications at Lockheed Martin Sanders," SPIE Conference on Algorithms, Devices, and Systems for Optical Information Processing, vol. 3466, Jul. 1998, pp. 145 to 156.

Thalken, Jason et al., "Adaptive Design of Excitonic Absorption in Broken-Symmetry Quantum Wells," Applied Physics Letters, vol. 85, No. 1, Jul. 5, 2004, pp. 121 to 123.

Woodward, T.K. et al., "Comparison of Stepped-Well and Square-Well Multiple-Quantum-Well Optical Modulators," J. Applied Physics, American Institute of Physics, vol. 78, No. 3, Aug. 1, 1995, pp. 1411 to 1414.

Mohseni, H. et al., "High-Performance Optical Modulators Based on Stepped Quantum Wells," Quantum Sensing and Nanophotonic Devices III, Proc. of SPIE, vol. 6127, 2006, pp. 61270D-1 to 61270D-11.

Islam M.N. et al., "Electroabsorption in GaAa/AlGaAs Coupled Quantum Well Waveguides," Applied Physics Letters, American Institute of Physics, vol. 50, No. 16, Apr. 20, 1987, pp. 1098 to 1100.

Debbar, Nacer, et al., "Coupled GaAs/AlGaAs Quantum-Well Electroabsorption Modulators for Low-Electric-Field Optical Modulation," J. Applied Physics, American Institute of Physics, vol. 65, No. 1, Jan. 1, 1989, pp. 383 to 385.

Powell, Jeffry, "Systems Applications of Vertical Cavity Multi Quantum Well Optoelectronic Modulators," Stanford University, Sep. 1997, pp. total 142.

Goossen, K.W. et al., "Stacked-Diode Electroabsorption Modulator," IEEE Photonics Technology Letters, vol. 6, No. 8, Aug. 1994, pp. 936 to 938.

Li, E. Herbert et al., "Quantum-Confined Stark Effect in Interdiffused AlGaAs/GaAs Quantum Well," Applied Physics Letters, American Institute of Physics, vol. 63, No. 4, Jul. 26, 1993, pp. 533 to 535.

Nakamura, Kenji et al., "Numerical Analysis of the Absorption and the Refractive Index Change in Arbitrary Semiconductor Quantum-Well Structures," IEEE Journal of Quantum Electronics, vol. 28, No. 7, Jul. 1992, pp. 1670 to 1677.

Trezza, J.A. et al., "Large Format Smart Pixel Arrays and their Applications," IEEE, 1998, pp. 299 to 310.

Trezza, J.A. et al., "Large, Low-Voltage Absorption Changes and Absorption Bistability in GaAs/AlGaAs/InGaAs Asymmetric Quantum Wells," J. Applied Physics, American Institute of Physics, vol. 74, No. 3, Aug. 1, 1993, pp. 1972 to 1978.

Trezza, J.A. et al., "Zero Chirp Asymmetric Fabry-Perot Electroabsorption Modulator Using Coupled Quantum Wells," IEEE Photonics Technology Letters, vol. 9, No. 3, Mar. 1997, pp. 330 to 332.

Tsai, et al.; "Reflection-Type Normally-On Two-Wavelength Modulator", Electronics Letters, Mar. 27, 1997, vol. 33, No. 7, 2 pages total.

Communication dated Apr. 8, 2015, issued by the European Patent Office in counterpart European Application No. 14175645.2.

* cited by examiner

FIG. 6

| Material | Thickness[Å] | Remarks | Doping |
|---|---|---|---|
| p-GaAs | 100 | p-contact | $1\times10^{18}cm^{-3}$ |
| $Al_{0.31}Ga_{0.69}As$ | 500 | Cladding | |
| $In_{0.20}Ga_{0.80}As$ | 10 | Active (3ACQW-15pair) | Undoped |
| $Al_{0.20}Ga_{0.80}As$ | 10 | | |
| GaAs | 64 | | |
| $Al_{0.20}Ga_{0.80}As$ | 10 | | |
| $In_{0.20}Ga_{0.80}As$ | 10 | | |
| $Al_{0.31}Ga_{0.69}As$ | 40 | | |
| $In_{0.20}Ga_{0.80}As$ | 10 | (3ACQW 1pair) | |
| $Al_{0.20}Ga_{0.80}As$ | 10 | | |
| GaAs | 64 | | |
| $Al_{0.20}Ga_{0.80}As$ | 10 | | |
| $In_{0.20}Ga_{0.80}As$ | 10 | | |
| $Al_{0.31}Ga_{0.69}As$ | 500 | Cladding | |
| n-InGaP | 1000 | n-contact | $2\times10^{18}cm^{-3}$ |
| GaAs substrate | | | |

FIG. 9

| | Remarks | Material | Thickness[Å] |
|---|---|---|---|
| 141 | p-contact | p-GaAs | 100 |
| 140 | Top DBR 1 pairs | p-Al$_{0.31}$Ga$_{0.69}$As | 516 |
| | | p-Al$_{0.88}$Ga$_{0.12}$As | 688 |
| | | p-Al$_{0.31}$Ga$_{0.69}$As | 623 |
| | | p-Al$_{0.88}$Ga$_{0.12}$As | 688 |
| 130 | Cladding | Al$_{0.31}$Ga$_{0.69}$As | 35 |
| | QW/Barrier 32 pairs (2-λ) | In$_{0.20}$Ga$_{0.80}$As | 10 |
| | | Al$_{0.20}$Ga$_{0.80}$As | 10 |
| | | GaAs | 64 |
| | | Al$_{0.20}$Ga$_{0.80}$As | 10 |
| | | In$_{0.20}$Ga$_{0.80}$As | 10 |
| | | Al$_{0.31}$Ga$_{0.69}$As | 40 |
| | 3ACQW spare 1 pair | In$_{0.20}$Ga$_{0.80}$As | 10 |
| | | Al$_{0.20}$Ga$_{0.80}$As | 10 |
| | | GaAs | 64 |
| | | Al$_{0.20}$Ga$_{0.80}$As | 10 |
| | | In$_{0.20}$Ga$_{0.80}$As | 10 |
| | Cladding | Al$_{0.31}$Ga$_{0.69}$As | 35 |
| 120 | Bottom DBR 25.5 pairs | n-Al$_{0.88}$Ga$_{0.12}$As | 688 |
| | | n-Al$_{0.31}$Ga$_{0.69}$As | 623 |
| | | n-Al$_{0.88}$Ga$_{0.12}$As | 688 |
| 111 | n-contact | n-GaAs | 5000 |
| 110 | | GaAs substrate | |

FIG. 12

| Remarks | 3ACQW | |
| --- | --- | --- |
| | Material | Thickness[Å] |
| 241 — Contact | p-GaAs | 100 |
| 240 — Top DBR 1 pair | p-Al$_{0.31}$Ga$_{0.69}$As | 516 |
| | p-Al$_{0.81}$Ga$_{0.19}$As | 678 |
| Top DBR 5 pairs | p-Al$_{0.31}$Ga$_{0.69}$As | 623 |
| | p-Al$_{0.81}$Ga$_{0.19}$As | 678 |
| Cladding | Al$_{0.31}$Ga$_{0.69}$As | 80 |
| 230 — QW/barrier (3-λ) | UNIT[Å]<br>40 — Al$_{0.3}$Ga$_{0.7}$As<br>10  10 — Al$_{0.2}$Ga$_{0.8}$As<br>64 — GaAs<br>10  10 — In$_{0.2}$Ga$_{0.8}$As<br>× 48 pairs | |
| Spare 1 pairs | In$_{0.20}$Ga$_{0.80}$As | 10 |
| | Al$_{0.20}$Ga$_{0.80}$As | 10 |
| | GaAs | 64 |
| | Al$_{0.20}$Ga$_{0.80}$As | 10 |
| | In$_{0.20}$Ga$_{0.80}$As | 10 |
| Cladding | Al$_{0.31}$Ga$_{0.69}$As | 80 |
| 220 — Bottom DBR 5 pairs | n-Al$_{0.81}$Ga$_{0.19}$As | 678 |
| | n-Al$_{0.31}$Ga$_{0.69}$As | 623 |
| Bottom DBR 1 pair | n-Al$_{0.81}$Ga$_{0.19}$As | 678 |
| | n-Al$_{0.31}$Ga$_{0.69}$As | 88 |
| 201 — Contact | n-GaAs | 500 |

FIG. 15

| Remarks | | 3ACQW with InGaAs coupling well | |
|---|---|---|---|
| | | Material | Thickness[Å] |
| 302 | Contact | p-GaAs | 100 |
| 344 | Top DBR<br>1 pair | p-Al$_{0.31}$Ga$_{0.69}$As | 516 |
| | | p-Al$_{0.81}$Ga$_{0.19}$As | 678 |
| 345 | Micro-cavity | p-Al$_{0.31}$Ga$_{0.69}$As | 1246 |
| 342 | Phase matching | p-Al$_{0.81}$Ga$_{0.19}$As | 678 |
| 341 | Middle DBR<br>15 pairs | p-Al$_{0.31}$Ga$_{0.69}$As | 623 |
| | | p-Al$_{0.81}$Ga$_{0.19}$As | 678 |
| | Cladding | Al$_{0.31}$Ga$_{0.69}$As | 51 |
| 330 | QW/barrier<br>(7-λ) | UNIT[Å]<br>Thin QW  40  Thick QW<br>10  10    10  10<br>   59         64<br>10  10    10  10<br>× 62 pairs   × 55 pairs | |
| | Spare<br>1 pairs | In$_{0.20}$Ga$_{0.80}$As | 10 |
| | | Al$_{0.20}$Ga$_{0.80}$As | 10 |
| | | GaAs | 64 |
| | | Al$_{0.20}$Ga$_{0.80}$As | 10 |
| | | In$_{0.20}$Ga$_{0.80}$As | 10 |
| | Cladding | Al$_{0.31}$Ga$_{0.69}$As | 51 |
| 320 | Bottom DBR<br>1 pair | n-Al$_{0.81}$Ga$_{0.19}$As | 678 |
| | | n-Al$_{0.31}$Ga$_{0.69}$As | 88 |
| 301 | Contact | n-GaAs | 500 |

(340 brackets 344, 345, 342, 341)

OPTICAL DEVICE INCLUDING THREE-COUPLED QUANTUM WELL STRUCTURE HAVING MULTI-ENERGY LEVEL

RELATED APPLICATION

This application claims priority from Korean Patent Application No. 10-2013-0134986, filed on Nov. 7, 2013, in the Korean Intellectual Property Office, the disclosure of which is incorporated herein in its entirety by reference.

BACKGROUND

1. Field

Apparatuses consistent with exemplary embodiments relate to an optical device including a three-coupled quantum well structure, and more particularly, to an optical device including a three-coupled quantum well structure having multi-energy level, which may improve light absorption intensity in a multiple quantum well structure without increasing a driving voltage.

2. Description of the Related Art 3D cameras have not only a general image capturing function but also a function of measuring a distance from a plurality of points on a surface of an object to the 3D cameras. A variety of algorithms to measure the distance between an object and a 3D camera have recently been suggested. A typical one of these algorithms is a time-of-flight (TOF) algorithm. According to a TOF method, illumination light is emitted onto an object and then a flight time, between when the illumination light is emitted until the illumination light reflected from the object is received by a light-receiving unit, is measured. The flight time of illumination light may be obtained by measuring a phase delay of the illumination light. A high-speed optical modulator is used to accurately measure the phase delay.

An optical modulator having a superior electro-optical response characteristic is used to obtain a 3D image with high distance accuracy. Recently, GaAs-based semiconductor optical modulators are mainly used. A GaAs-based semiconductor optical modulator has a P-I-N diode structure in which a multiple quantum well (MQW) structure is disposed between a P-electrode and an N-electrode. In the structure, when a reverse bias voltage is applied between the P-N electrodes, the MQW structure forms excitons in a particular wavelength band and absorbs light. An absorption spectrum of the MQW structure characteristically moves toward a long wavelength as a reverse bias voltage increases. Accordingly, a degree of absorption at a particular wavelength may vary according to a change in the reverse bias voltage. Thus, according to the above principle, the intensity of incident light having a particular wavelength may be modulated by adjusting the reverse bias voltage applied to an optical modulator.

In the optical modulator, a distance accuracy increases as a contrast ratio, for example, a demodulation contrast, indicating a difference in the degree of absorption between when a voltage is applied and is not applied, increases. Driving at a low voltage is advantageous to prevent performance deterioration due to heat. In general, an increase in the contrast ratio may be achieved by increasing light absorption intensity and transition energy in the MQW structure. The light absorption intensity is inversely proportional to the thickness of a quantum well layer and is proportional to a square of a degree of superimposition between a hole's wave function and an electron's wave function in the quantum well layer. Also, transition energy that indicates a degree of an absorption spectrum moving toward a long wavelength is proportional to the fourth power of the thickness of a quantum well layer and to the square of an applied voltage.

However, when the thickness of a quantum well layer is reduced to increase the light absorption intensity, the transition energy decreases and an applied voltage increases in order to compensate for a decrease in the transition energy. On the other hand, when the thickness of a quantum well layer is increased to increase the transition energy, the degree of superimposition between a hole's wave function and an electron's wave function decreases and generation of excitons by electron-hole pairs is reduced so that absorption intensity decreases. Thus, the improvement of absorption intensity and the reduction of a drive voltage are in a trade-off relationship.

SUMMARY

Additional exemplary aspects will be set forth in part in the description which follows and, in part, will be apparent from the description, or may be learned by practice of the presented embodiments.

According to an aspect of an exemplary embodiment, an optical device includes an active layer comprising at least two outer barriers and at least one coupled quantum well that is inserted between the at least two outer barriers, in which each coupled quantum well comprises at least three quantum well layers and at least two coupling barriers, wherein each of the coupling barriers is provided between two of the quantum well layers, thicknesses of two quantum well layers disposed at opposite ends of the coupled quantum well are different from a thickness of the other quantum well layer disposed between the two quantum well layers, and energy levels of the two quantum well layers disposed at the opposite ends are different from an energy level of the other quantum well layer disposed between the two quantum well layers.

Potential energies of the at least two coupling barriers may be higher than a ground level and lower than energy levels of the outer barriers.

Each of the coupled quantum wells may be a three-coupled quantum well that comprises a first quantum well layer, a first coupling barrier, a second quantum well layer, a second coupling barrier, and a third quantum well layer which are sequentially stacked, and potential energies of the first and second coupling barriers are higher than a ground level and lower than energy levels of the outer barriers.

A thickness of the first quantum well layer and a thickness of the third quantum well layer may be less than a thickness of the second quantum well layer, and an energy level of the first quantum well layer and an energy level of the third quantum well layer may be lower than an energy level of the second quantum well layer.

For an infrared range of about 850 nm, the first and third quantum well layers may comprise $In_zGa_{1-z}As$, where $z=0.1$~$0.2$, the second quantum well layer may comprise GaAs, the first and second coupling barriers may comprise $Al_yGa_{1-y}As$, where $0<y<1$, and the outer barriers may comprise $Al_xGa_{1-x}As$, where $0<y<x<=1$.

According to an aspect of another exemplary embodiment, an optical device includes an active layer including at least two outer barriers and at least one coupled quantum well that is inserted between the at least two outer barriers, and a lower reflection layer and an upper reflection layer that are respectively disposed on lower and upper surfaces of the active layer, in which each coupled quantum well has at least three quantum well layers and at least two coupling barriers, each of the coupling barriers provided between two of the at least three quantum well layers, and energy levels of the two quantum well layers disposed at opposite ends of the coupled quantum well are different from an energy level of the other quantum well layer disposed between the two quantum well layers.

The optical device may be a reflective optical modulator, in which a reflectivity of the lower reflection layer is higher than a reflectivity of the upper reflection layer.

Thicknesses of the two quantum well layers disposed at the opposite ends may be less than a thickness of the other quantum well layer disposed between the two quantum well layers.

The optical device may further include at least one microcavity layer that is disposed within at least one of the lower and upper reflection layers, in which, when a resonance wavelength of the optical device is $\lambda$, the active layer and the at least one microcavity each have an optical thickness that is an integer multiple of $\lambda/2$.

The at least one coupled quantum well may include at least one first coupled quantum well comprising a first quantum well layer, a first coupling barrier, a second quantum well layer, a second coupling barrier, and a third quantum well layer which are sequentially stacked, and at least one second coupled quantum well comprising a fourth quantum well layer, a third coupling barrier, a fifth quantum well layer, a fourth coupling barrier, and a sixth quantum well layer which are sequentially stacked, in which a thickness of the second quantum well layer of the first coupled quantum well is different from a thickness of the fifth quantum well layer of the second coupled quantum well.

The potential energies of the first to fourth coupling barriers each may be higher than a ground level and lower than energy levels of the outer barriers.

A thickness of the first quantum well layer and a thickness of the third quantum well layer each may be less than a thickness of the second quantum well layer, and a thickness of the fourth quantum well layer and a thickness of the sixth quantum well layer each may be less than a thickness of the fifth quantum well layer.

An energy level of the first quantum well layer and an energy level of the third quantum well layer each are lower than an energy level of the second quantum well layer, and an energy level of the fourth quantum well layer and an energy level of the sixth quantum well layer each are lower than an energy level of the fifth quantum well layer.

Thicknesses of the first and third quantum well layers of the first coupled quantum well each may be respectively the same as thicknesses of each of the fourth and sixth quantum well layers of the second coupled quantum well.

Each of the at least one coupled quantum well may include a first quantum well layer, a first coupling barrier, a second quantum well layer, a second coupling barrier, and a third quantum well layer which are sequentially stacked. The active layer may further include at least one single quantum well, each of the at least one single quantum well including a single fourth quantum well layer provided between two outer barriers.

According to an aspect of another exemplary embodiment, an optical device includes a lower reflection layer, a first active layer disposed on the lower reflection layer, an intermediate reflection layer disposed on the first active layer, a second active layer disposed on the intermediate reflection layer, and an upper reflection layer disposed on the second active layer, in which at least one of the first and second active layers comprises a coupled quantum well structure that comprises at least two outer barriers and at least one coupled quantum well inserted between the two outer barriers, each coupled quantum well comprises at least three quantum well layers and at least two coupling barriers, wherein each of the coupling barriers is provided between two of the at least three quantum well layers, thicknesses of two quantum well layers disposed at opposite end portions of the at least three quantum well layers each are less than a thickness of the other quantum well layer disposed between the two quantum well layers, and energy levels of the two quantum well layers disposed at the opposite end portions each are lower than an energy level of the other quantum well layer disposed between the two quantum well layers.

Potential energies of the at least two coupling barriers each may be higher than a ground level and lower than energy levels of each of the outer barriers.

Each of the coupled quantum wells may be a three-coupled quantum well that includes a first quantum well layer, a first coupling barrier, a second quantum well layer, a second coupling barrier, and a third quantum well layer which are sequentially stacked, and potential energies of the first and second coupling barriers each may be higher than a ground level and lower than energies level of each of the outer barriers.

A thickness of the first quantum well layer and a thickness of the third quantum well layer each may be less than a thickness of the second quantum well layer, and an energy level of the first quantum well layer and an energy level of the third quantum well layer each may be lower than an energy level of the second quantum well layer.

The lower and upper reflection layers each may be doped into a first electric type and the intermediate reflection layer may be doped into a second electric type that is opposite to the first electric type.

The optical device may further include at least one microcavity layer that is disposed in at least one of the lower and upper reflection layers, in which, when a resonance wavelength of the optical device is $\lambda$, the active layer and the at least one microcavity each have an optical thickness that is an integer multiple of $\lambda/2$.

BRIEF DESCRIPTION OF THE DRAWINGS

These and/or other exemplary aspects and advantages will become apparent and more readily appreciated from the following description of exemplary embodiments, taken in conjunction with the accompanying drawings in which:

FIG. 6 illustrates a detailed an optical device having a three-coupled quantum well structure according to an exemplary embodiment;

FIG. 9 illustrates a detailed example of the reflective optical modulator of FIG. 8;

FIG. 12 illustrates a detailed example of the transmissive optical modulator of FIG. 11;

FIG. 15 illustrates a detailed example of the transmissive optical modulator of FIG. 14;

DETAILED DESCRIPTION

Figure 1:
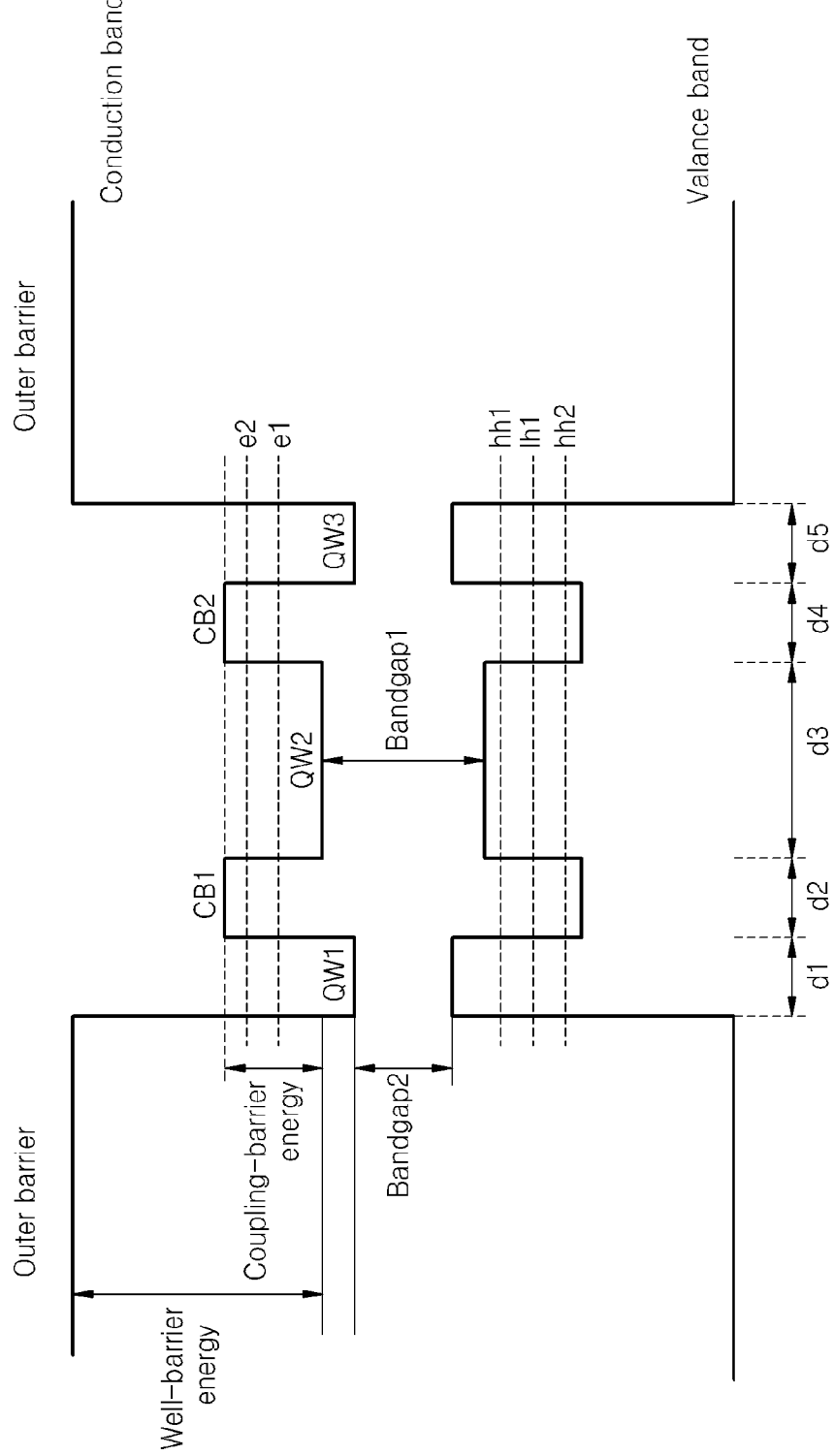
FIG. 1 is an energy band diagram of an active layer having a three-coupled quantum well structure, according to an exemplary embodiment.

Reference will now be made in detail to exemplary embodiments which are illustrated in the accompanying drawings, wherein like reference numerals refer to like elements throughout. Also, the size of each layer illustrated in the drawings may be exaggerated for convenience of explanation and clarity. In this regard, the present embodiments may have different forms and should not be construed as being limited to the descriptions set forth herein. Accordingly, the embodiments are merely described below, by referring to the figures, to explain aspects of the present description. In a layer structure, when a constituent element is disposed "above" or "on" to another constituent element, the constituent element may be only directly on the other constituent element or above the other constituent elements in a non-contact manner.

FIG. 1 is an energy band diagram of an active layer having a three-coupled quantum well structure, according to an exemplary embodiment. Referring to FIG. 1, the active layer according to the present embodiment may include two outer barriers and a three-coupled quantum well inserted between the two outer barriers. Although FIG. 1 illustrates only two outer barriers and one three-coupled quantum well, more outer barriers and three-coupled quantum wells may be included. For example, the active layer may include at least two outer barriers and at least one three-coupled quantum well inserted between each pair of two outer barriers.

Each three-coupled quantum well may include a first quantum well layer. QW1, a first coupling barrier CB1, a second quantum well layer QW2, a second coupling barrier CB2, and a third quantum well layer QW3, which are sequentially disposed. In the three-coupled quantum well structure, three quantum well layers may be coupled to one another by two coupling barriers. Accordingly, in the overall structure of the active layer, the three-coupled quantum well may perform a function similar to a single quantum well. As a result, since the thickness of the three-coupled quantum well structure that functions as a single quantum well layer is thicker than that of a single quantum well layer, transition energy may be increased without increasing a driving voltage.

In general, when a degree of superimposition between a hole's wave function and an electron's wave function is large, generation of excitons that are pairs of an electron and a hole increases and thus the light absorption intensity of an optical device increases. According to the present embodiment, to improve the light absorption intensity of the optical device including the active layer of FIG. 1, the thickness of the second quantum well layer QW2 may be the thickest of the three quantum well layers, so that a portion where the hole's wave function and the electron's wave function are superimposed is increased. As the thickness of the second quantum well layer QW2 is the thickest, a hole's wave function portion and an electron's wave function portion remaining in the second quantum well layer QW2 increases so that superimposition between the hole's wave function and the electron's wave function may be increased.

To further increase the light absorption intensity, thicknesses d1 and d5 of the first and third quantum well layers QW1 and QW3, which are disposed at the opposite sides of the second quantum well layer, may be less than a thickness d3 of the second quantum well layer QW2 that is disposed therebetween. Also, in order to prevent the driving voltage from increasing as the thicknesses d1 and d5 of the first and third quantum well layers QW1 and QW3 decrease, energy levels of the first and third quantum well layers QW1 and QW3 may be lower than an energy level of the second quantum well layer QW2. Accordingly, a Bandgap 1 of the second quantum well layer QW2 may be larger than a Bandgap 2 of the first and third quantum well layers QW1 and QW3. The thicknesses and levels of the first and third quantum well layers QW1 and QW3 may be the same or different. From this point of view, the quantum well structure of the present embodiment may be referred to be a three-coupled quantum well structure having multi-level energy.

To couple the three quantum well layers QW1 to QW3, the two coupling barriers CB1 and CB2 may have energy levels that are lower than the energy level of the outer barriers, as illustrated in FIG. 1. For example, in a conduction band indicated in an upper side of the energy band diagram of FIG. 1, potential energies of the first and second coupling barriers CB1 and CB2 may be higher than a ground level, that is, an energy level of a first electron e1, and lower than the energy level of the outer barriers. Likewise, in a valance band indicated in a lower side of the energy band diagram of FIG. 1, potential energies of the first and second coupling barriers CB1 and CB2 may be higher than a ground level, that is, an energy level of a first heavy hole hh1, and lower than the energy level of the outer barriers. In such a structure, as the widths of the first, second, and third quantum well layers QW1, QW2, and QW3 are increased, the ground level is lowered and an absorption wavelength is moved toward a long wavelength. When the barrier energies of the first and second coupling barriers CB1 and CB2 are increased, the ground level rises and thus the absorption wavelength may be moved toward a short wavelength.

Materials for the first, second, and third quantum well layers QW1, QW2, and QW3, the first and second coupling barriers CB1 and CB2, and the outer barriers satisfying the above conditions may be diversely selected according to a desired wavelength band. For example, for an infrared range of about 850 nm, $In_zGa_{1-z}As$ ($z=0.1$~$0.2$) may be used for the first and third quantum well layers QW1 and QW3, GaAs may be used for the second quantum well layer QW2, $Al_yGa_{1-y}As$ ($0<y<1$) used for the first and second coupling barriers CB1 and CB2, and $Al_xGa_{1-x}As$ ($0<y<x<1$) may be used for the outer barriers. Also, for a mid-infrared range of about 1550 nm, $In_xGa_{1-x}As$, $In_{1-x-y}Ga_xAl_yAs$, and $In_{1-x}Ga_xAs_zP_{1-z}$, etc. may be used for the first, second, and third quantum well layers QW1, QW2, and QW3, and $In_{1-x-y}Ga_xAl_yAs$ and $In_{1-x}Ga_xAs_zP_{1-z}$ (0<x, y, z<1), etc. may be used for the first and second coupling barriers CB1 and CB2 and the outer barriers. The above materials may be used in a variety of combinations according to the above-described conditions. The energy levels of the first and second coupling barriers CB1 and CB2 and the outer barriers may be appropriately adjusted according to a composition ratio of the materials.

Figure 2A:
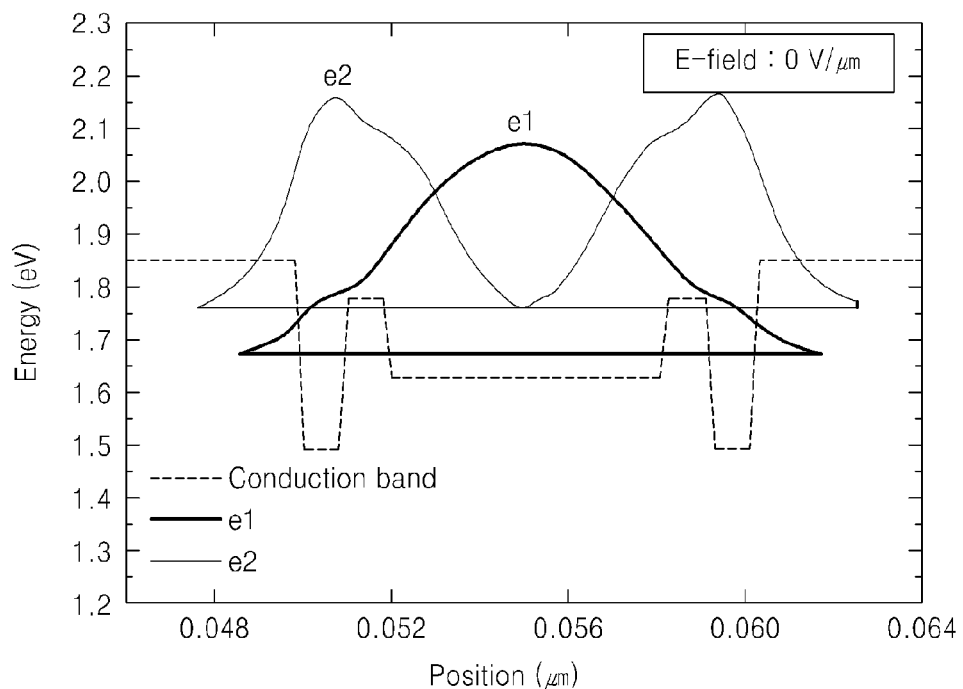
FIGS. 2A and 2B illustrate an electron's wave function and a hole's wave function, respectively, when a reverse bias voltage is not applied to the active layer of FIG. 1.
Figure 2B:
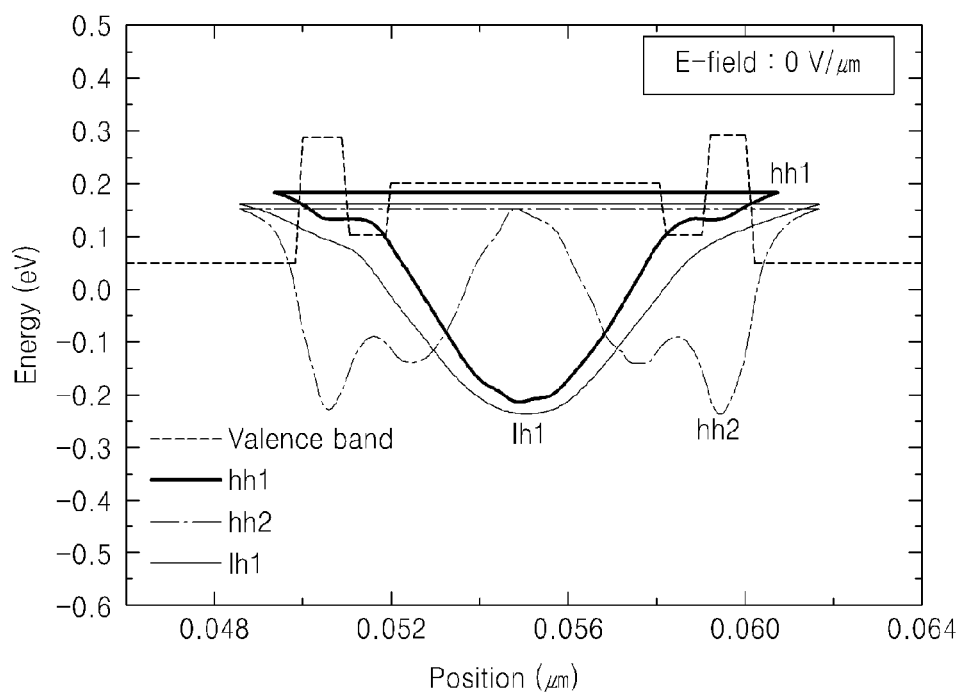

Since the first, second, and third quantum well layers QW1, QW2, and QW3 are connected to one another by the first and second coupling barriers CB1 and CB2, electron's and hole's wave functions may be distributed across the first, second, and third quantum well layers QW1, QW2, and QW3 over the first and second coupling barriers CB1 and CB2. For example, FIGS. 2A and 2B illustrate an electron's wave function and a hole's wave function, respectively, when a reverse bias voltage is not applied to the active layer of FIG. 1. Referring to FIG. 2A, a wave function of a first electron e1 is mainly distributed in the second quantum well layer QW2 and a wave function of a second electron e2 is mainly distributed in the first and third quantum well layers QW1 and QW3. Referring to FIG. 2B, a wave function of a first heavy hole hh1 and a wave function of a first light hole lh1 are mainly distributed in the second quantum well layer QW2 and a wave function of a second heavy hole hh2 is mainly distributed in the first and third quantum well layers QW1 and QW3.

Figure 3A:
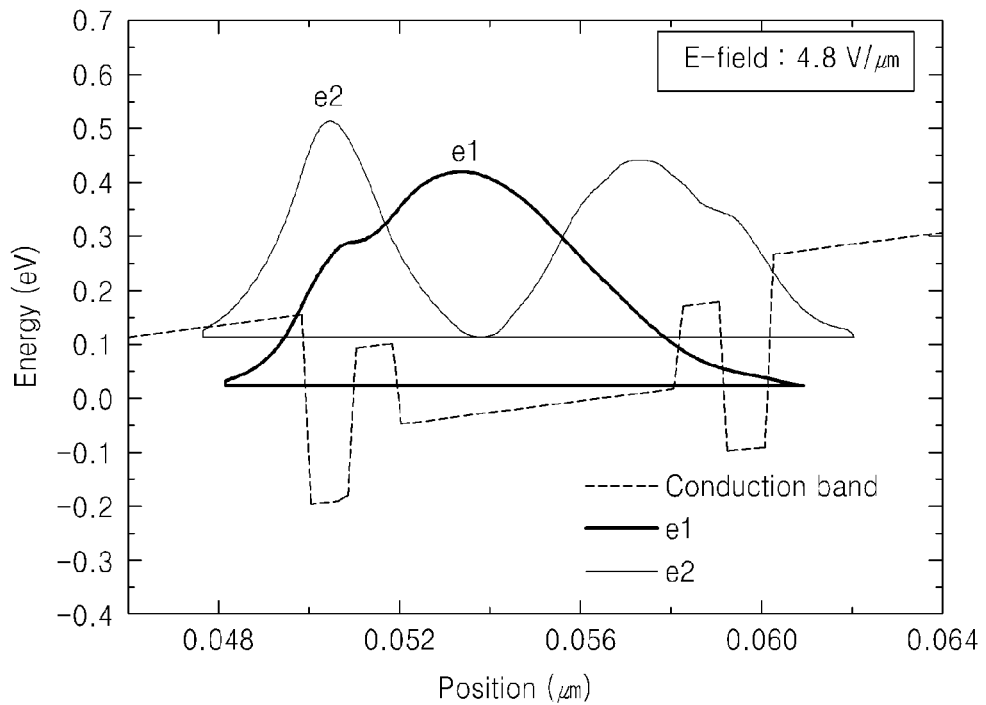
FIGS. 3A and 3B illustrate an electron's wave function and a hole's wave function, respectively, when a reverse bias voltage is applied to the active layer of FIG. 1.
Figure 3B:
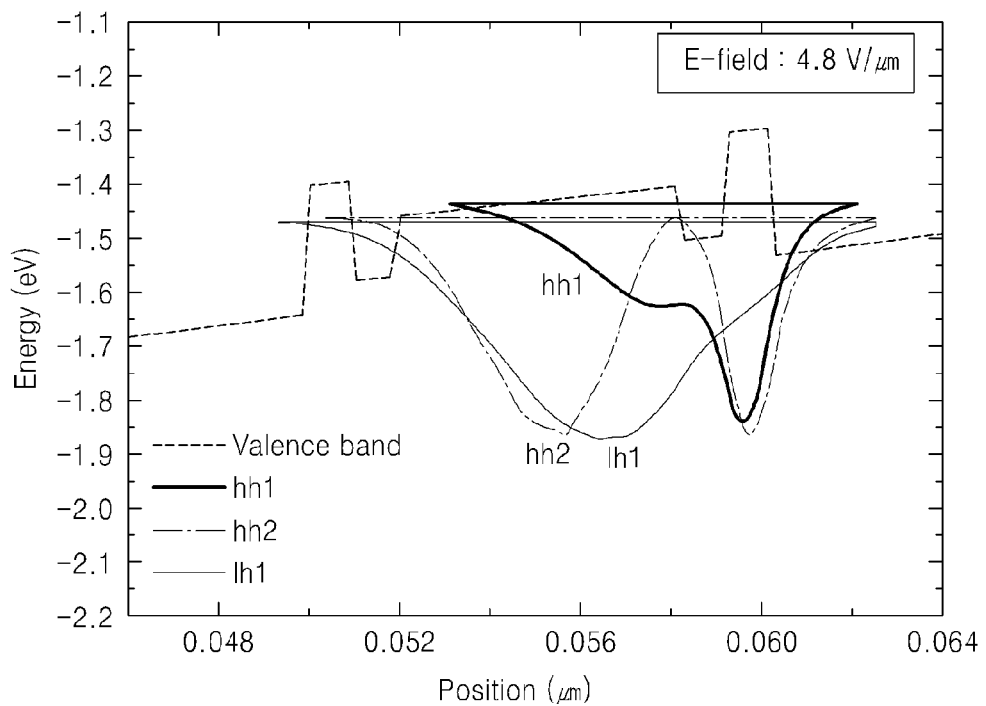

When a reverse bias voltage is applied to the active layer, the electron's wave function is moved in a direction toward the first quantum well layer QW1 and the hole's wave function is moved in a direction toward the third quantum well layer QW3. For example, FIGS. 3A and 3B illustrate the electron's wave function and the hole's wave function, respectively, when the reverse bias voltage is applied to the active layer of FIG. 1. Referring to FIG. 3A, a peak of the wave function of the first electron e1 is slightly moved to the left edge of the second quantum well layer QW2 and a second peak of the second electron e2 is moved to the right edge of the second quantum well layer QW2. Since the thickness of the first quantum well layer QW1 is small, strong absorption occurs in the first quantum well layer QW1 and thus electron mobility according to a voltage is lowered. Accordingly, the wave functions of the first and second electrons e1 and e2 are widely distributed across the three quantum well layers QW1, QW2, and QW3. Also, referring to FIG. 3B, a peak of the wave function of the first heavy hole hh1 is moved toward the third quantum well layer QW3 and deformed to a shape of a saddle by the second coupling barrier CB2 and partially remains in the second quantum well layer QW2. Also, peaks of the wave function of the second heavy hole hh2 and the wave function of the first light hole lh1 are located in the second quantum well layer QW2. Accordingly, the electron's and hole's wave functions are superimposed across a wide area in the second and third quantum well layers QW2 and QW3 so that light absorption may be increased.

Figure 4:
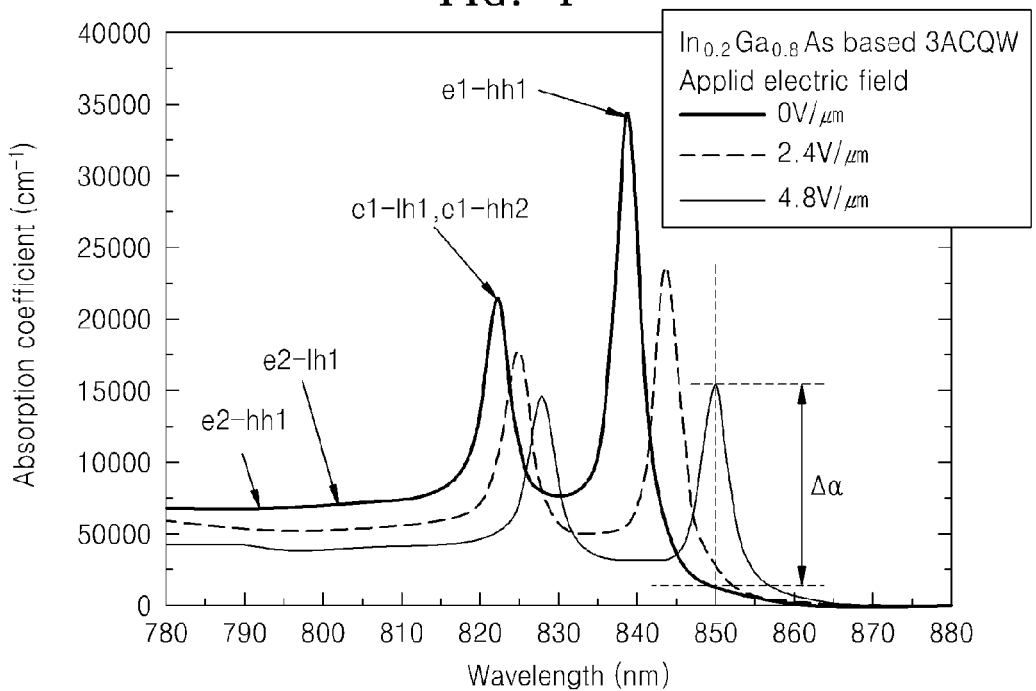
FIG. 4 illustrates an absorption spectrum in the active layer having the three-coupled quantum well structure of FIG. 1.

FIG. 4 illustrates an absorption spectrum in the active layer having the three-coupled quantum well structure of FIG. 1: in detail, absorption spectrums with respect to externally applied electric fields of about 0 V/μm, about 2.4 V/μm, and about 4.8 V/μm. Referring to FIG. 4, when the externally applied electric field is about 0 V/μm, the largest peak is generated in a wavelength of about 838 nm. The largest peak is generated by an exciton pair of the first electron e1 and the first heavy hole hh1 and the second largest peak is generated by an exciton pair of the first electron e1 and the first light hole lh1 and an exciton pair of the first electron e1 and the second heavy hole hh2. Since an absorption coefficient is very small at the wavelength of about 850 nm, light having a wavelength of about 850 nm mostly passes through the active layer. When the externally applied electric field increases, an absorption spectrum is moved toward a long wavelength according to the Stark effect and absorption intensity is reduced. When the externally applied electric field is about 4.8 V/μm, the absorption spectrum has the largest peak at a wavelength of about 850 nm. In this case, the peak of the absorption spectrum is lower than that in a case in which the externally applied electric field is about 0 V/μm. The above movement of the absorption spectrum toward the wavelength of about 850 nm may be achieved at an externally applied electric field of about 8.1 V/μm in a simple single quantum well structure.

Also, according to the present embodiment, even when an external electric field of about 4.8 V/μm is applied to the active layer, as illustrated in FIGS. 3A and 3B, a considerable amount of the electron's and hole's wave functions remain in the second quantum well layer QW2 so that an absorption coefficient that is higher than that of the simple single quantum well structure may be maintained. In other words, in the present embodiment, a degree that absorption intensity decreases as the absorption spectrum is moved toward a long wavelength is less than that of the simple single quantum well structure. Accordingly, a difference Δα in the absorption intensity at a wavelength of about 850 μm between when the externally applied electric field is about 0 V/μm and when the externally applied electric field is about 4.8 V/μm may be larger than that of the simple single quantum well structure.

Figure 5:
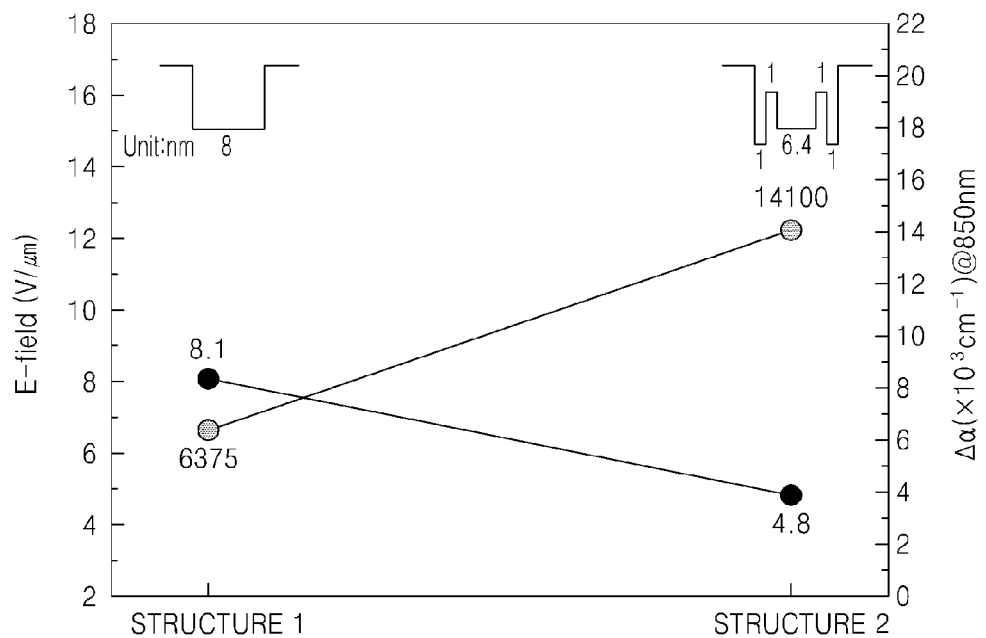
FIG. 5 illustrates a light absorption characteristic in the active layer having the three-coupled quantum well structure of FIG. 1, in comparison with a simple single quantum well structure.

For example, FIG. 5 illustrates a light absorption characteristic in the active layer having the three-coupled quantum well structure of FIG. 1, in comparison with a simple single quantum well structure. In the graph of FIG. 5, Structure 1 is a single quantum well structure including a GaAs quantum well layer having a thickness of about 8 nm and an $Al_{0.30}Ga_{0.70}As$ barrier. Structure 2 is the three-coupled quantum well structure of the present embodiment that includes the outer barriers formed of $Al_{0.30}Ga_{0.70}As$, the first and second coupling barriers CB1 and CB2 formed of $Al_{0.20}Ga_{0.80}As$ and having a thickness of about 1 nm, the first and third quantum well layers QW1 and QW3 formed of $In_{0.20}Ga_{0.80}As$ and having a thickness of 1 nm, and the second quantum well layer QW2 formed of GaAs and having a thickness of about 6.4 nm. Referring to FIG. 5, a driving voltage of Structure 2 is about 4.8 V/μm, which is lower than 8.1 V/μm that is a driving voltage of Structure 1. Also, the absorption intensity difference Δα of Structure 2 is about 14100×10³/cm, which is much improved compared to 6375× 10³/cm, that is, the absorption intensity difference of Structure 1.

FIG. 6 illustrates an optical device having a three-coupled quantum well structure according to an exemplary embodiment. Referring to FIG. 6, n-InGaP is formed on a GaAs substrate to have a thickness of about 100 nm as an n-contact layer. An Al0.31Ga0.69As lower cladding layer that functions as an outer barrier is formed on the n-contact layer to have a thickness of about 50 nm. Sixteen (16) pairs of the three-coupled quantum wells including first quantum well layer formed of $In_{0.20}Ga_{0.80}As$ and having a thickness of about 1 nm, a first coupling barrier formed of $Al_{0.20}Ga_{0.80}As$ and having a thickness of about 1 nm, a second quantum well layer formed of GaAs and having a thickness of about 6.4 nm, a second coupling barrier formed of $Al_{0.20}Ga_{0.80}As$ and having a thickness of about 1 nm, and a third quantum well layer formed of $In_{0.20}Ga_{0.80}As$ and having a thickness of about 1 nm, are stacked on the $Al_{0.31}Ga_{0.69}As$ cladding layer. $Al_{0.31}Ga_{0.69}As$ having a thickness of about 4 nm is inserted between the three-coupled quantum wells as an outer barrier.

An $Al_{0.31}Ga_{0.69}As$ upper cladding layer is formed on the sixteenth three-coupled quantum well to a thickness of about 50 nm, and p-GaAs is formed thereon as a p-contact layer to a thickness of about 10 nm. The cladding layers may be relatively thick so as to function both as outer barriers and dispersion prevention layers to prevent a dopant of a contact layer entering into a quantum well. The above layers may be stacked by using equipment for molecular beam epitaxy (MBE) or metal organic chemical vapor deposition (MOCVD). Also, to manufacture a transmissive optical modulator, the GaAs substrate may be partially removed by wet etching to transmit light. In this case, an n-InGaP layer may function as an etch stop layer.

Figure 7:
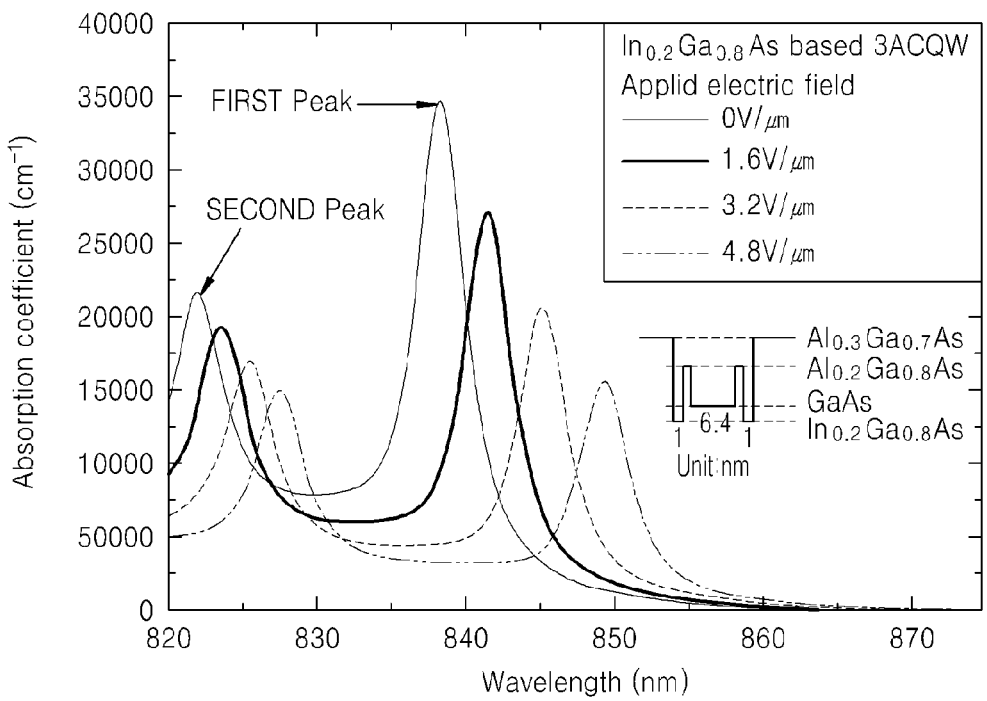
FIG. 7 schematically illustrates an absorption coefficient spectrum of the optical device of FIG. 6.

FIG. 7 schematically illustrates an absorption coefficient spectrum of the optical device of FIG. 6. Referring to FIG. 7, when no voltage is applied, a first exciton absorption peak is located at a wavelength of about 838 nm. When an electric field of about 4.8 V/μm is applied, the first exciton absorption peak is located at a wavelength of about 860 nm. As it is confirmed above, in the simple single quantum well having the same cavity thickness, an electric field of about 8.1 V/μm is needed to move the first exciton absorption peak located at about 838 nm to about 850 nm. Accordingly, the optical device including the three-coupled quantum well according to the present embodiment may have a rather low driving voltage while having improved light absorption intensity as compared to that of the single quantum well structure.

Accordingly, the optical device including a three-coupled quantum well according to the present embodiment may simultaneously achieve an improved light absorption characteristic and a low drive voltage compared to an optical device including different quantum well structures. The optical device including the three-coupled quantum well structure may be applied not only to an optical modulator but also to a semiconductor device having a variety of PIN diode structures to absorb light of a particular wavelength band. For example, the above-described principle may be applied to an optical filter, a photodiode, a solar cell, a light-emitting device, a light communication system, an optical interconnection, an optical calculator, etc.

The optical modulator having a variety of structures adopting the above-described three-coupled quantum well structure will be described below in detail.

Figure 8:
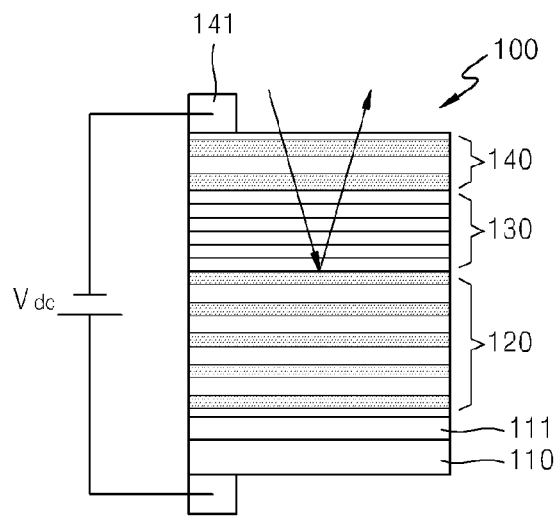
FIG. 8 schematically illustrates a structure of a reflective optical modulator having the three-coupled quantum well structure according to an exemplary embodiment.

FIG. 8 schematically illustrates a structure of a reflective optical modulator 100 having a three-coupled quantum well structure. Referring to FIG. 8, the reflective optical modulator 100 may include a substrate 110, a first contact layer 111 disposed on the substrate 110, a lower reflection layer 120 disposed on the first contact layer 111, an active layer 130 disposed on the lower reflection layer 120, an upper reflection layer 140 disposed on the active layer 130, and a second contact layer 141 disposed on the upper reflection layer 140. The upper and lower reflection layers 140 and 120 may be doped to function both as reflection layers and electrical paths. For example, the first contact layer 111 and the lower reflection layer 120 may be doped into an n type, whereas the upper reflection layer 140 and the second contact layer 141 may be doped into a p type. The active layer 130 is undoped. As such, the reflective optical modulator 100 of FIG. 8 has a P-I-N diode structure.

The reflective optical modulator 100 reflects incident light and also modulates an intensity of reflected light by absorbing part of the incident light according to an electric signal. To reflect the incident light, the lower reflection layer 120 has a reflectivity of about 90% or more and the upper reflection layer 140 may have a reflectivity of about 30%-50%. The lower and upper reflection layers 120 and 140 may be, for example, distributed Bragg reflectors (DBRs) obtained by repeatedly and alternately stacking a low refractive index layer having a relatively low refractive index and a high refractive index layer having a relatively high refractive index. In the above structure, reflection occurs on an interface between two layers having different refractive indexes, that is, the high refractive index layer and the low refractive index layer. A high reflectivity may be obtained by making phase differences of all reflected light identical to one another. To this end, an optical thickness, that is, a value obtained by multiplying a physical thickness by a refractive index of a layer material, of each of the high and low refractive index layers in the lower and upper reflection layers 120 and 140 may be an odd-number multiple of about $\lambda/4$, where $\lambda$ is a resonance wavelength of the reflective optical modulator 100. Also, the reflectivity may be adjusted as desired according to the number of stacks of pairs of the high and low refractive index layers.

The active layer 130 is a layer where light absorption occurs and may have a multiple quantum well layer structure in which the above-described three-coupled quantum well structure and the outer barriers are repeatedly stacked. The active layer 130 may function as the main cavity for Fabry-Perot resonance. To this end, an optical thickness of the active layer 130 may be approximately an integer multiple of $\lambda/2$.

FIG. 9 illustrates a detailed example of the reflective optical modulator 100 of FIG. 8. Referring to FIG. 9, the first contact layer 111 having a thickness of about 500 nm is formed on the substrate 110 formed of GaAs. The first contact layer 111 may be formed of n-GaAs. The lower reflection layer 120 includes an $n-Al_{0.88}Ga_{0.12}As$ layer having a thickness of 68.8 nm as a low refractive index layer and an $n-Al_{0.31}Ga_{0.69}As$ layer having a thickness of 62.3 nm as a high refractive index layer and has a structure in which a pair of the low and high refractive index layers is stacked about 25.5 times. To function as a current path, the lower reflection layer 120 may be doped to a concentration of about $3.18 \times 10^{18}/cm^3$ by using silicon as a dopant.

The active layer 130 may include an $Al_{0.31}Ga_{0.69}As$ lower cladding layer having a thickness of about 3.5 nm that is formed on the lower reflection layer 120 and functions as the outer barrier, thirty-three (33) pairs of three-coupled quantum wells including a first quantum well layer formed of $In_{0.20}Ga_{0.80}As$ and having a thickness of about 1 nm, a first coupling barrier formed of $Al_{0.20}Ga_{0.80}As$ and having a thickness of about 1 nm, a second quantum well layer formed of GaAs and having a thickness of about 6.4 nm, a second coupling barrier formed of $Al_{0.20}Ga_{0.80}As$ and having a thickness of about 1 nm, a third quantum well layer formed of $In_{0.20}Ga_{0.80}As$ and having a thickness of about 1 nm, an outer barrier formed of $Al_{0.31}Ga_{0.69}As$ and having a thickness of about 4 nm, which is disposed between the three-coupled quantum wells, and an upper cladding layer formed of $Al_{0.31}Ga_{0.69}As$ and having a thickness of about 3.5 nm, which is disposed on the thirty-third ($33^{rd}$) three-coupled quantum well. The optical thickness of the active layer 130 is set to be $2\lambda$.

Also, the upper reflection layer 140 on the upper cladding layer includes a $p-Al_{0.88}Ga_{0.12}As$ layer having a thickness of 68.8 nm as a low refractive index layer and a $p-Al_{0.31}Ga_{0.69}As$ layer having a thickness of 62.3 nm as a high refractive index layer. The upper reflection layer 140 having a low reflectivity may only have two pairs of a high refractive index layer and a low refractive index layer. To function as a current path, the upper reflection layer 140 may be doped to a concentration of about $4.6 \times 10^{18}/cm^3$ to $6.5 \times 10^{18}/cm^3$ using beryllium as a dopant. A p-GaAs layer having a thickness of about 10 nm may be formed on the upper reflection layer 140 as the second contact layer 141.

Figure 10:
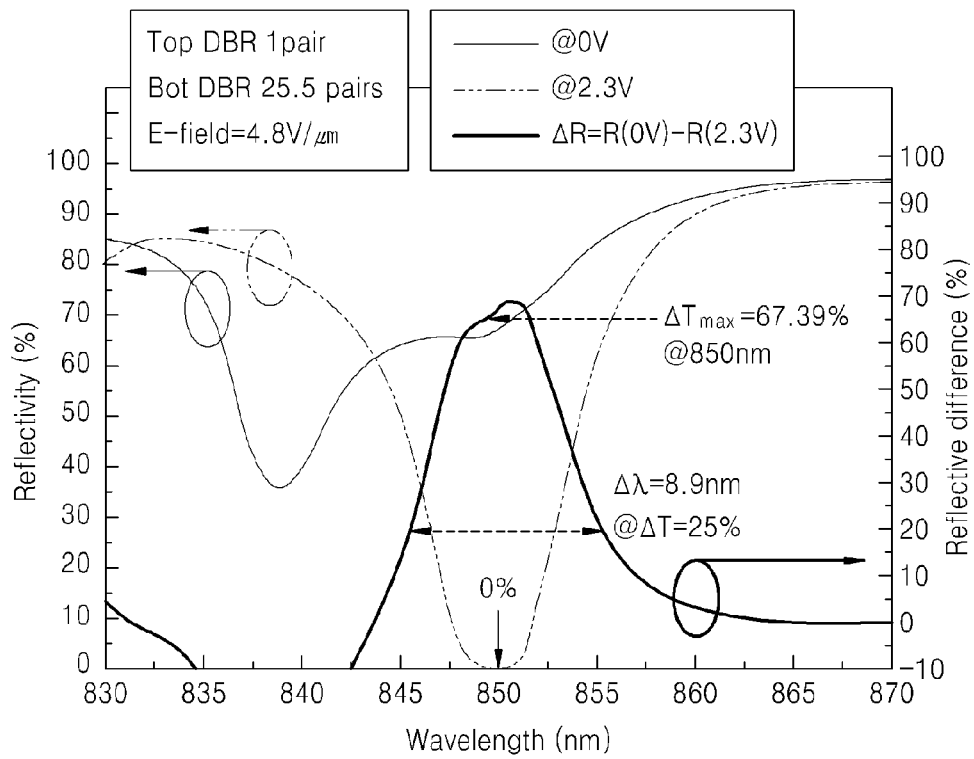
FIG. 10 schematically illustrates a reflection characteristic of the reflective optical modulator of FIG. 9.

FIG. 10 schematically illustrates a reflection characteristic of the reflective optical modulator 100 of FIG. 9. In FIG. 10, a graph indicated by a thin solid line denotes reflectivity when a voltage is not applied and relates to a left vertical axis. A graph indicated by a two-dash chain line denotes reflectivity when a voltage of about 2.3 V is applied and relates to the left vertical axis. A graph indicated by a thick solid line denotes a difference in the reflectivity between when a voltage is not applied and when a voltage is applied and relates to a right vertical axis. Referring to FIG. 10, the maximum absorption occurs at a wavelength of about 850 nm at a relatively low voltage of about −2.3 V and a difference in the reflectivity between the minimum reflectivity and the maximum reflectivity in a range of about 850 nm is about 67.4%. In particular, reflectivity is almost 0% when a voltage of about −2.3 V is applied. Accordingly, it may be seen that a contrast ratio of the reflective optical modulator 100 of FIG. 9 is greatly improved.

Figure 11:
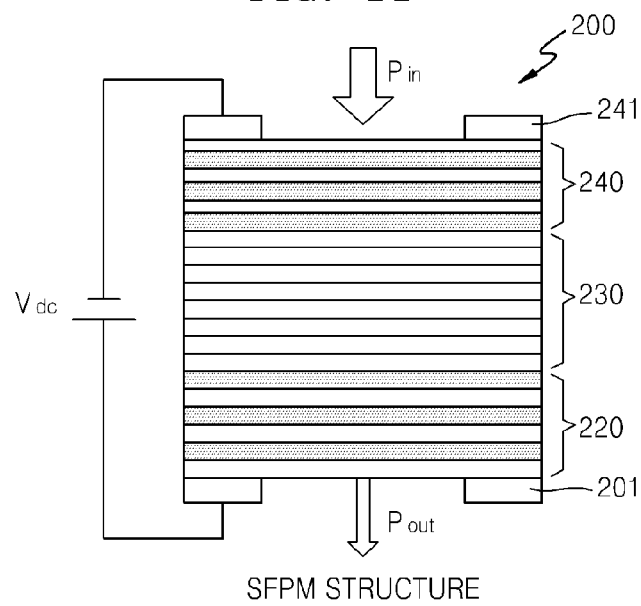
FIG. 11 schematically illustrates a structure of a transmissive optical modulator having the three-coupled quantum well structure, according to an exemplary embodiment.

FIG. 11 schematically illustrates a structure of a transmissive optical modulator 200 having a three-coupled quantum well structure, according to an exemplary embodiment. Referring to FIG. 11, the transmissive optical modulator 200 according to the present embodiment may include a lower reflection layer 220, an active layer 230 disposed on the lower reflection layer 220, an upper reflection layer 240 disposed on the active layer 230, a first contact layer 201 disposed on a part of a lower surface of the lower reflection layer 220, and a second contact layer 241 disposed on a part of an upper surface of the upper reflection layer 240. The first and second contact layers 201 and 241 may be in the form of a ring along edges of the lower reflection layer 220 and the upper reflection layer 240 so that light may pass through openings of the first and second contact layers 201 and 241. Although it is not illustrated in FIG. 11, a substrate may be removed after the transmissive optical modulator 200 is formed on the substrate. Alternately, only a center portion of the substrate may be partially removed so that light may pass therethrough. As described above, the upper reflection layer 240 and the lower reflection layer 220 may be doped to function both as reflection layers and electric paths.

The transmissive optical modulator 200 modulates an intensity of projected light by absorbing part of incident light according to an electric signal while transmitting the incident light. The lower reflection layer 220 and the upper reflection layer 240 transmit part of the incident light and also reflect light so that resonance may occur in the active layer 230 that is the main cavity. In the case of the transmissive optical modulator 200, the reflectivity of the lower reflection layer 220 and the upper reflection layer 240 may be about 50% identical.

FIG. 12 illustrates a detailed example of the transmissive optical modulator 200 of FIG. 11. Referring to FIG. 12, the lower reflection layer 220 including six (6) pairs of a high refractive index layer formed of n-$Al_{0.31}Ga_{0.69}As$ and a low refractive index layer formed of n-$Al_{0.81}Ga_{0.19}As$ is disposed on the first contact layer 201 formed of n-GaAs and having a thickness of about 50 nm. The high refractive index layer disposed lowermost may have a smaller thickness than the thickness of other high refractive index layers for phase matching.

The active layer 230 disposed on the lower reflection layer 220 includes lower and upper cladding layers formed of $Al_{0.31}Ga_{0.69}As$ having a thickness of 8 nm and functioning as the outer barriers and a total forty-nine pairs of three-coupled quantum wells disposed between the lower and upper cladding layers. Each three-coupled quantum well may include a first quantum well layer formed of $In_{0.20}Ga_{0.80}As$ and having a thickness of about 1 nm, a first coupling barrier formed of $Al_{0.20}Ga_{0.80}As$ and having a thickness of about 1 nm, a second quantum well layer formed of GaAs and having a thickness of about 6.4 nm, a second coupling barrier formed of $Al_{0.20}Ga_{0.80}As$ and having a thickness of about 1 nm, and a third quantum well layer formed of $In_{0.20}Ga_{0.80}As$ and having a thickness of about 1 nm. Also, an outer barrier formed of $Al_{0.30}Ga_{0.70}As$ and having a thickness of about 4 nm may be inserted between two neighboring three-coupled quantum wells. The optical thickness of the active layer 230 is set to be about 3λ.

The upper reflection layer 240 and the lower reflection layer 220 are symmetrically disposed with respect to the active layer 230. For example, like the lower reflection layer 220, the upper reflection layer 240 includes six (6) pairs of a high refractive index layer formed of n-$Al_{0.31}Ga_{0.69}As$ and a low refractive index layer formed of n-$Al_{0.81}Ga_{0.19}As$. Also, a high refractive index layer disposed atop may have a smaller thickness than the thickness of other high refractive index layers for phase matching. The second contact layer 241 that is formed of p-GaAs may be disposed on the upper reflection layer 240.

Figure 13:
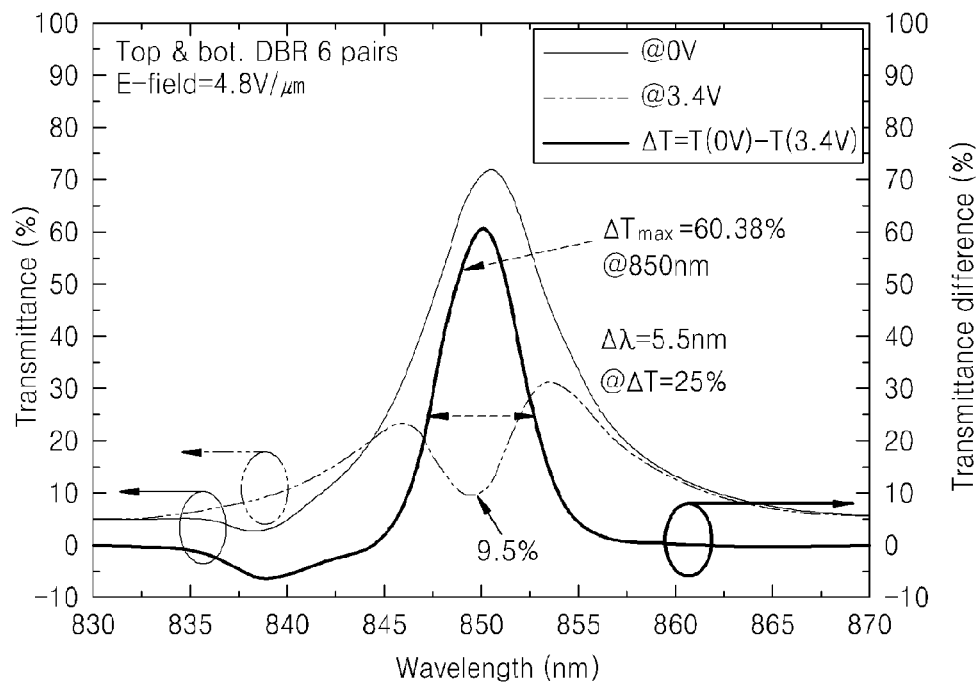
FIG. 13 schematically illustrates a transmittance characteristic of the transmissive optical modulator of FIG. 12.

FIG. 13 schematically illustrates a transmittance characteristic of the transmissive optical modulator 200 of FIG. 12. In FIG. 13, a graph indicated by a thin solid line denotes transmittance when a voltage is not applied and relates to a left vertical axis. A graph indicated by a two-dash chain line denotes transmittance when a voltage is applied and relates to the left vertical axis. A graph indicated by a thick solid line denotes a difference in the transmittance between when a voltage is not applied and when a voltage is applied and relates to a right vertical axis. Referring to FIG. 13, the maximum absorption occurs at a wavelength of about 850 nm at a relatively low voltage of about −3.4 V and a difference in the transmittance between the minimum transmittance and the maximum transmittance in a range of about 850 nm is improved to about 60.4%. In particular, since transmittance is lowered to less than or equal to 10% due to an increase in the light absorption when a voltage is applied, a difference in the transmittance may be improved.

A general optical modulator has a characteristic that a center absorption wavelength varies according to a change in temperature and variables in a manufacturing process. In order to maintain a modulation characteristic constant in spite of the changes, it is advantageous to perform modulation uniformly across a wide wavelength band. In other words, it is advantageous that the optical modulator has a wide bandwidth.

Figure 14:
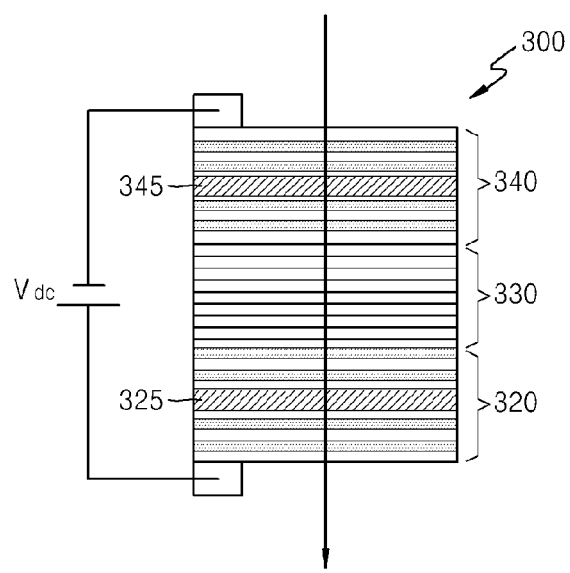
FIG. 14 schematically illustrates a structure of a transmissive optical modulator having the three-coupled quantum well structure, according to another exemplary embodiment.

FIG. 14 schematically illustrates a structure of a transmissive optical modulator 300 having a three-coupled quantum well structure and designed to have a wide bandwidth, according to another exemplary embodiment. Referring to FIG. 14, the transmissive optical modulator 300 may include a lower reflection layer 320, an active layer 330 disposed on the lower reflection layer 320, an upper reflection layer 340 disposed on the active layer 330, a first microcavity layer 325 disposed in the lower reflection layer 320, and a second microcavity layer 345 disposed in the upper reflection layer 340. The active layer 300 is a main cavity for Fabry-Perot resonance, and the first and second microcavity layers 325 and 345 function as additional cavity for Fabry-Perot resonance. To this end, an optical thickness of each of the first and second microcavity layers 325 and 345 may approximately be an integer multiple of λ/2. The first and second microcavity layers 325 and 345 may each be formed of a high refractive index layer material or a low refractive index layer material of the lower and upper reflection layers 320 and 340. Both of the first and second microcavity layers 325 and 345 may be disposed in either the lower reflection layer 320 or the upper reflection layer 340. Either one of the first and second microcavity layers 325 and 345 may be omitted.

Although it is not explicitly illustrated in FIG. 14, it is possible to make the thicknesses of quantum well layers in the active layer 330 to be different from one another in order to increase a bandwidth. For example, two or more types of second quantum well layers having different thicknesses may be formed by changing the thickness of the second quantum well layer where electron's and hole's wave functions are superimposed. An absorption mode increases through the addition of the first and second microcavity layers 325 and 345 and the change in the thickness of the quantum well layer and thus a light absorption bandwidth of the transmissive optical modulator 300 may be improved.

FIG. 15 illustrates a detailed example of the transmissive optical modulator 300 of FIG. 14. Referring to FIG. 15, the lower reflection layer 320 includes a pair of a high refractive index layer formed of n-$Al_{0.31}Ga_{0.69}As$ and a low refractive index layer formed of n-$Al_{0.81}Ga_{0.19}As$, which are formed on an n-GaAs contact layer 301. In an example of FIG. 15, a microcavity layer is not formed in the lower reflection layer 320. However, the second microcavity layer 345 is formed in the upper reflection layer 340. The upper reflection layer 340 may be separated into a first upper reflection layer 341 and a second upper reflection layer 344 by the second microcavity layer 345. The first upper reflection layer 341 disposed under the second microcavity layer 345 may include fifteen (15) pairs of a high refractive index layer and a low refractive index layer. The second upper reflection layer 344 disposed above the second microcavity layer 345 may include one pair of a high refractive index layer and a low refractive index layer. However, this is a mere example, and the number of pairs of the lower reflection layer 320, the first upper reflection layer 341, and the second upper reflection layer 344 may be appropriately selected according to a desired reflectivity characteristic of the lower and upper reflection layers 320 and 340. In the example of FIG. 15, the second microcavity layer 345 may be formed of a high refractive index layer material and have an optical thickness of $\lambda/2$.

Also, a phase matching layer 342 may be further provided between the second microcavity layer 345 and the first upper reflection layer 341. The phase matching layer 342 is inserted such that the higher refractive index layer and the low refractive index layer are alternately disposed in the entire structure of the upper reflection layer 340 including the second microcavity layer 345. For example, when the second microcavity layer 345 is formed of a high refractive index layer material, the phase matching layer 342 may be formed of a low refractive index layer material. When the second microcavity layer 345 is formed of a low refractive index layer material, the phase matching layer 342 may be formed of a high refractive index layer material.

As illustrated in FIG. 15, the active layer 330 includes lower and upper cladding layers formed of $Al_{0.31}Ga_{0.69}As$ and having a thickness of about 5.1 nm, as the outer barriers, and two types of three-coupled quantum well structures disposed between the lower and upper cladding layers. The two types of three-coupled quantum well structures may both include a plurality of three-coupled quantum wells having a first quantum well layer/a first coupling barrier/a second quantum well layer/a second coupling barrier/a third quantum well layer. An outer barrier may be interposed between the three-coupled quantum wells. The materials and thicknesses of the first quantum well layer, the first coupling barrier, the second coupling barrier, the third quantum well layer, and the outer barrier may be the same as those of the above-described embodiments.

However, in the two types of three-coupled quantum well structures, the thickness of the second quantum well layer may be different. For example, while the second quantum well layer in a first three-coupled quantum well structure may be formed of GaAs having a thickness of about 6.4 nm, and the second quantum well layer in a second three-coupled quantum well structure may be formed of GaAs having a thickness of about 5.9 nm. The first three-coupled quantum well structure may include a total of fifty-six (56) pairs of three-coupled quantum wells and the second three-coupled quantum well structure may include a total of sixty-two (62) pairs of three-coupled quantum wells. Also, although FIG. 15 shows that the first three-coupled quantum well structure is first formed and then the second three-coupled quantum well structure may be formed on the first three-coupled quantum well structure, three-coupled quantum wells of the first three-coupled quantum well structure and three-coupled quantum wells of the second three-coupled quantum well structure may be disposed by being combined with each other. As such, when the two different types of second quantum well layers having different thicknesses are used, two absorption modes are formed in the active layer 330 so that the light absorption bandwidth may be improved. The overall optical thickness of the active layer 230 is set to $7\lambda$.

Figure 16:
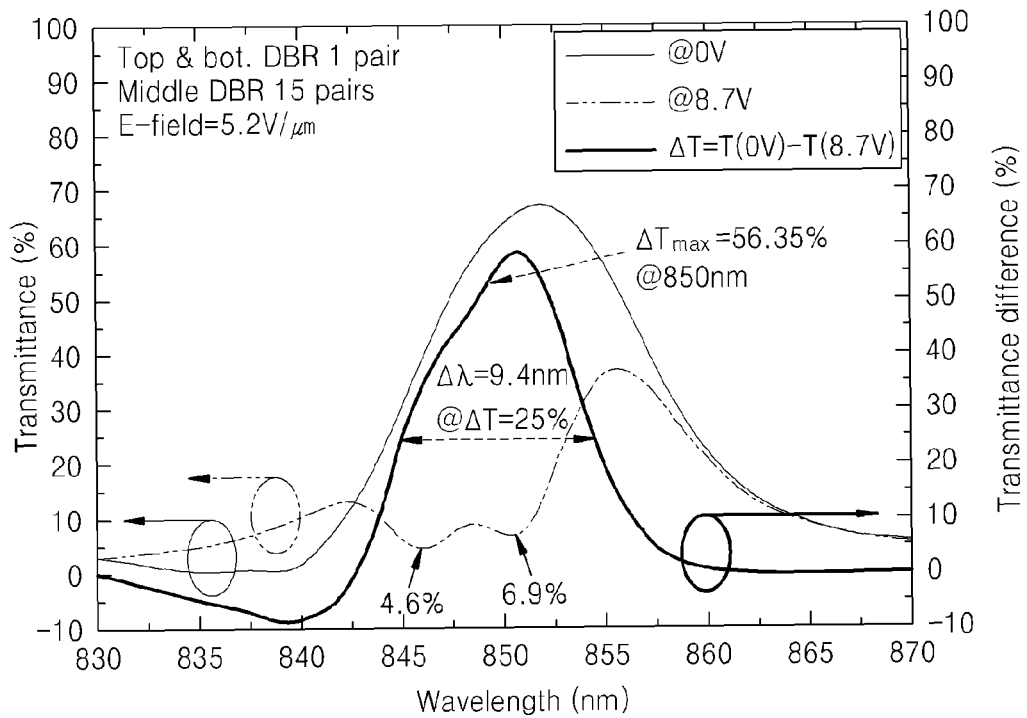
FIG. 16 schematically illustrates a transmittance characteristic of the transmissive optical modulator of FIG. 15.

FIG. 16 schematically illustrates a transmittance characteristic of the transmissive optical modulator 300 of FIG. 15. In FIG. 16, a graph indicated by a thin solid line denotes transmittance when a voltage is not applied. A graph indicated by a two-dash chain line denotes transmittance when a voltage is applied. A graph indicated by a thick solid line denotes a difference in the transmittance between the graph indicated by a thin solid line and the graph indicated by the two-dash chain line. As illustrated in the graph of FIG. 16, a transmittance difference of about 56.4% may be obtained at a wavelength of about 850 nm at a driving voltage of about −8.7 V and it may be seen that a bandwidth in which the transmittance difference is 25% or more is about 9.4 nm. In particular, light absorption increases with respect to the wavelength of about 850 nm at the driving voltage of about −8.7 V so that the transmittance is lowered to about 7% and a contrast ratio, for example, demodulation contrast, may be further improved.

In the example of FIG. 15, the second microcavity layer 345 is disposed in the upper reflection layer 340 and two types of three-coupled quantum well structures are disposed in the active layer 330. However, one or more microcavities may be further added to the lower reflection layer 320 and/or the upper reflection layer 340. Also, the active layer 330 may include a combination of one type of a three-coupled quantum well structure and one type of a single quantum well structure. The structure of the second microcavity layer 345 and the active layer 330 of FIG. 15 may be applied to the reflective optical modulator 100 of FIG. 8.

Figure 17:
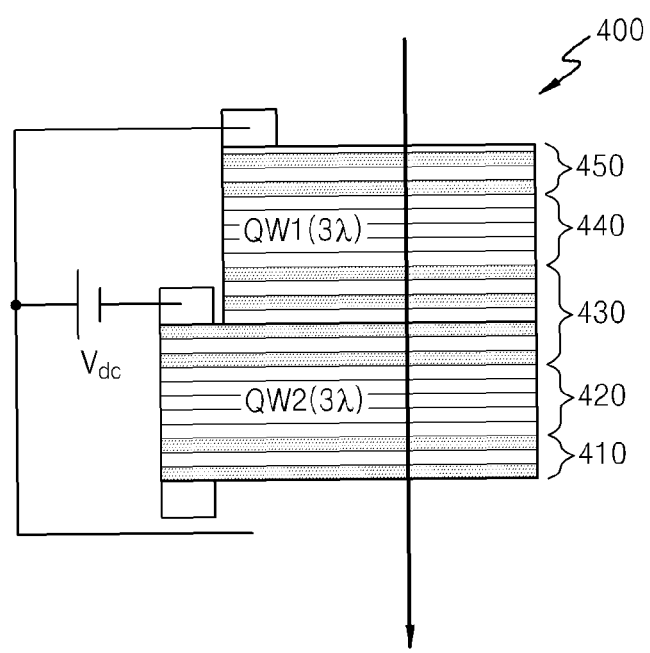
FIG. 17 schematically illustrates a structure of a transmissive optical modulator having the three-coupled quantum well structure, according to another exemplary embodiment.

FIG. 17 schematically illustrates a structure of a transmissive optical modulator 400 having a three-coupled quantum well structure, according to another exemplary embodiment. Referring to FIG. 17, the transmissive optical modulator 400 may include a lower reflection layer 410, a first active layer 420 disposed on the lower reflection layer 410, an intermediate reflection layer 430 disposed on the first active layer 420, a second active layer 440 disposed on the intermediate reflection layer 430, and an upper reflection layer 450 disposed on the second active layer 440. The lower and upper reflection layers 410 and 450 may be doped into the same electrical type, whereas the intermediate reflection layer 430 may be doped into an opposite electric type to the lower and upper reflection layers 410 and 450. For example, the lower and upper reflection layers 410 and 450 may be doped into an n type, whereas the intermediate reflection layer 430 may be doped into a p type. Alternatively, the lower and upper reflection layers 410 and 450 may be doped into a p type, whereas the intermediate reflection layer 430 may be doped into an n type. Accordingly, the transmissive optical modulator 400 of FIG. 17 may have an N-I-P-I-N or P-I-N-I-P structure.

The transmissive optical modulator 400 may have a stack-type diode structure in which two diodes are stacked and electrically connected in parallel. In general, a driving voltage of an optical modulator is proportional to the total thickness of the active layer, or the total number of quantum well layers in the active layer. However, in the transmissive optical modulator 400 according to the present embodiment, since the two active layers, namely, the first and second active layers 420 and 440, are electrically connected to each other in parallel, the driving voltage may be reduced approximately by half compared to an optical modulator having one active layer having a thickness equivalent to a sum of the thicknesses of the two active layers, namely, the first and second active layers 420 and 440. Accordingly, power consumption may be additionally reduced so that deterioration in the performance of the transmissive optical modulator 400 due to heat may be reduced.

Also, according to the present embodiment, a bandwidth of the transmissive optical modulator 400 may be increased by forming the three-coupled quantum well structure of the first active layer 420 and the three-coupled quantum well structure of the second active layer 440 differently. In other words, absorption modes are increased through a multi-resonance mode in which a resonance wavelength of the first active layer 420 and a resonance wavelength of the second active layer 440 are different, and the light absorption bandwidth of the transmissive optical modulator 400 may be increased. For example, the thickness of the second quantum well layer in the three-coupled quantum well structure of the first active layer 420 and the thickness of the second quantum well layer in the three-coupled quantum well structure of the second active layer 440 may be selected to be different. Also, the first active layer 420 may include two or more types of three-coupled quantum well structures, and the second active layer 440 may include two or more types of three-coupled quantum well structures.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments of the present disclosure have been described with reference to the figures, it will be understood by those of ordinary skill in the art that various changes in form and details may be made therein without departing from the spirit and scope of the present disclosure as defined by the following claims.

What is claimed is:

1. An optical device comprising:
an active layer comprising two outer barriers and a coupled quantum well disposed between the two outer barriers,
wherein the coupled quantum well comprises a first quantum well layer, a second quantum well layer, and a third quantum well layer, a first coupling barrier disposed between the first quantum well layer and the second quantum well layer, and a second coupling barrier disposed between the second quantum well layer and the third quantum well layer,
wherein a thickness of the first quantum well layer and a thickness of the third quantum well layer, disposed at opposite ends of the coupled quantum well, are each less than a thickness of the second quantum well layer disposed between the first quantum well layer and the third quantum well layer, and
wherein an energy level of the first quantum well layer and an energy level of the third quantum well layer are each lower than an energy level of the second quantum well layer.

2. The optical device of claim 1, wherein a potential energy of the first coupling barrier and a potential energy of the second coupling barrier are each higher than a ground level and lower than energy levels of the outer barriers.

3. The optical device of claim 1, wherein, for an infrared range of about 850 nm, the first and third quantum well layers comprise $In_zGa_{1-z}As$, where $z=0.1\sim0.2$, the second quantum well layer comprises GaAs, the first and second coupling barriers comprise $Al_yGa_{1-y}As$, where $0<y<1$, and the outer barriers comprise $Al_xGa_{1-x}As$, where $0<y<x<=1$.

4. An optical device comprising:
an active layer comprising two outer barriers and a coupled quantum well disposed between the two outer barriers; and
a lower reflection layer disposed on a lower surface of the active layer and an upper reflection layer disposed an upper surface of the active layer,
wherein the coupled quantum well comprises a first quantum well layer, a second quantum well layer, and a third quantum well layer, a first coupling barrier disposed between the first quantum well layer and the second quantum well layer, and a second coupling barrier disposed between the second quantum well layer and the third quantum well layer,
wherein a thickness of the first quantum well layer and a thickness of the third quantum well layer, disposed at opposite ends of the coupled quantum well, are each less than a thickness of the second quantum well layer, disposed between the first quantum well layer and the third quantum well layer, and
wherein an energy level of the first quantum well layer and an energy level of the third quantum well layer are each lower than an energy level of the second quantum well layer.

5. The optical device of claim 4, wherein the optical device is a reflective optical modulator, and
a reflectivity of the lower reflection layer is higher than a reflectivity of the upper reflection layer.

6. The optical device of claim 4, further comprising a microcavity layer disposed within at least one of the lower reflection layer and the upper reflection layer,
wherein, a resonance wavelength of the optical device is λ, and an optical thickness of the active layer and an optical thickness of the microcavity layer are each an integer multiple of λ/2.

7. The optical device of claim 4, wherein the coupled quantum well comprises a first coupled quantum well and a second coupled quantum well, wherein:
the first coupled quantum well comprises the first quantum well layer, the first coupling barrier, the second quantum well layer, the second coupling barrier, and the third quantum well layer; and
the second coupled quantum well comprises a fourth quantum well layer, a third coupling barrier, a fifth quantum well layer, a fourth coupling barrier, and a sixth quantum well layer which are sequentially stacked, wherein a thickness of the second quantum well layer of the first coupled quantum well is different from a thickness of the fifth quantum well layer of the second coupled quantum well.

8. The optical device of claim 7, wherein potential energies of the first coupling barrier, the second coupling barrier, the third coupling barrier, and the fourth coupling barrier are each higher than a ground level and lower than energy levels of the outer barriers.

9. The optical device of claim 7, wherein a thickness of the fourth quantum well layer and a thickness of the sixth quantum well layer are each less than the thickness of the fifth quantum well layer.

10. The optical device of claim 7, wherein an energy level of the fourth quantum well layer and an energy level of the sixth quantum well layer are lower than an energy level of the fifth quantum well layer.

11. The optical device of claim 7, wherein a thickness of the first quantum well layer is the same as a thickness of the fourth quantum well layer, and a thickness of the third quantum well layer is the same as a thickness of the sixth quantum well layer.

12. The optical device of claim 4, wherein the active layer further comprises a single quantum well comprising a single fourth quantum well layer disposed between two outer barriers.

13. An optical device comprising:
a lower reflection layer;
a first active layer disposed on the lower reflection layer;
an intermediate reflection layer disposed on the first active layer;
a second active layer disposed on the intermediate reflection layer; and
an upper reflection layer disposed on the second active layer,
wherein at least one of the first active layer and the second active layer comprises a coupled quantum well structure comprising two outer barriers and a coupled quantum well disposed between the two outer barriers,
wherein the coupled quantum well comprises a first quantum well layer, a second quantum well layer, and a third quantum well layer, a first coupling barrier disposed between the first quantum well layer and the second quantum well layer, and a second coupling barrier disposed between the second quantum well layer and the third quantum well layer,
wherein a thickness of the first quantum well layer and a thickness of the third quantum well layer, disposed at opposite ends of the coupled quantum well are each less than a thickness of the second quantum well layer, and
wherein an energy level of the first quantum well layer and an energy level of the third quantum well layer are each lower than an energy level of the second quantum well layer.

14. The optical device of claim 13, wherein a potential energy of the first coupling barrier and a potential energy of the second coupling barrier are each higher than a ground level and lower than energy levels of the outer barriers.

15. The optical device of claim 13, wherein, for an infrared range of about 850 nm, the first and third quantum well layers comprise $In_zGa_{1-z}As$, where $z=0.1\sim0.2$, the second quantum well layer comprises GaAs, the first and second coupling barriers comprise $Al_yGa_{1-y}As$, where $0<y<1$, and the outer barriers comprise $Al_xGa_{1-x}As$, where $0<y<x<=1$.

16. The optical device of claim 13, wherein the lower reflection layer and the upper reflection layer are doped into a first electric type and the intermediate reflection layer is doped into a second electric type that is opposite to the first electric type.

17. The optical device of claim 13, further comprising a microcavity layer that is disposed within at least one of the lower reflection layer and the upper reflection layer,
wherein, a resonance wavelength of the optical device is $\lambda$, and an optical thickness of the active layer and an optical thickness of the microcavity are each an integer multiple of $\lambda/2$.

18. An optical modulator comprising:
an active layer comprising a first outer barrier, a second outer barrier, and a three-coupled quantum well disposed between the first outer barrier and the second outer barrier;
wherein the three-coupled quantum well comprises:
a first quantum well layer, a second quantum well layer, a third quantum well layer, a first coupling barrier disposed between the first quantum well layer and the second quantum well layer, and a second coupling barrier disposed between the second quantum well layer and the third quantum well layer;
wherein a potential energy of the first coupling barrier and a potential energy of the second coupling barrier are each higher than a ground level, lower than a potential energy level of the first outer barrier, and lower than a potential energy level of the second outer barrier;
wherein an energy level of the first quantum well layer and an energy level of the third quantum well layer are each lower than an energy level of the second quantum well layer.

* * * * *